United States Patent
Ker et al.

(10) Patent No.: US 7,675,723 B2
(45) Date of Patent: Mar. 9, 2010

(54) TRANSIENT TO DIGITAL CONVERTERS

(75) Inventors: Ming-Dou Ker, Hsinchu (TW);
Cheng-Cheng Yen, Hsinchu (TW);
Chi-Sheng Liao, Hsinchu (TW);
Tung-Yang Chen, Tainan County (TW)

(73) Assignees: Himax Technologies Limited, Tainan County (TW); National Chiao-Tung University, Hsinchu (TW)

( * ) Notice: Subject to any disclaimer, the term of this patent is extended or adjusted under 35 U.S.C. 154(b) by 230 days.

(21) Appl. No.: 12/047,356

(22) Filed: Mar. 13, 2008

(65) Prior Publication Data

US 2009/0231765 A1    Sep. 17, 2009

(51) Int. Cl.
*H02H 9/00*    (2006.01)
*H02H 3/20*    (2006.01)
*H02H 9/04*    (2006.01)
*H02H 3/22*    (2006.01)

(52) U.S. Cl. .................. 361/56; 361/91.1; 361/111; 361/118

(58) Field of Classification Search ............ 361/56, 361/91.1, 111, 118
See application file for complete search history.

(56) References Cited

U.S. PATENT DOCUMENTS

| | | | |
|---|---|---|---|
| 6,433,985 B1 * | 8/2002 | Voldman et al. | 361/113 |
| 6,952,677 B1 * | 10/2005 | Absar et al. | 704/500 |
| 7,128,491 B2 * | 10/2006 | Kobayashi | 401/188 A |
| 7,209,332 B2 * | 4/2007 | Stockinger et al. | 361/56 |
| 2005/0141158 A1 * | 6/2005 | Sae-Ueng et al. | 361/91.1 |
| 2007/0002512 A1 * | 1/2007 | Schonenberger | 361/118 |

* cited by examiner

*Primary Examiner*—Stephen W Jackson
*Assistant Examiner*—Dharti H Patel
(74) *Attorney, Agent, or Firm*—Thomas, Kayden, Horstemeyer & Risley

(57) ABSTRACT

A digital converter including a first adjustment unit and a first transient detection unit. The first adjustment unit adjusts amplitude of an electrostatic discharge (ESD) pulse to generate a first adjustment signal when an ESD event occurs in a first power line and a second power line is at a complementary level. The first transient detection unit generates a first digital code according to the first adjustment signal.

24 Claims, 7 Drawing Sheets

| Digital Code | ESD Voltage (kV) |
|---|---|
| 0000 | <0.8 |
| 0001 | 0.8~1.2 |
| 0011 | 1.2~1.8 |
| 0111 | 1.8~3.1 |
| 1111 | >3.1 |

FIG. 3

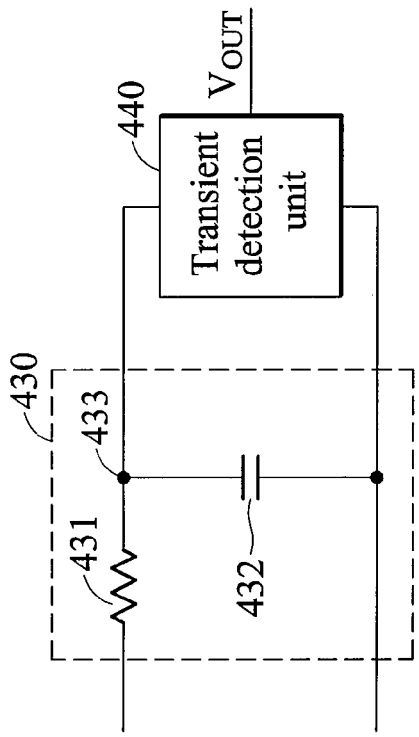
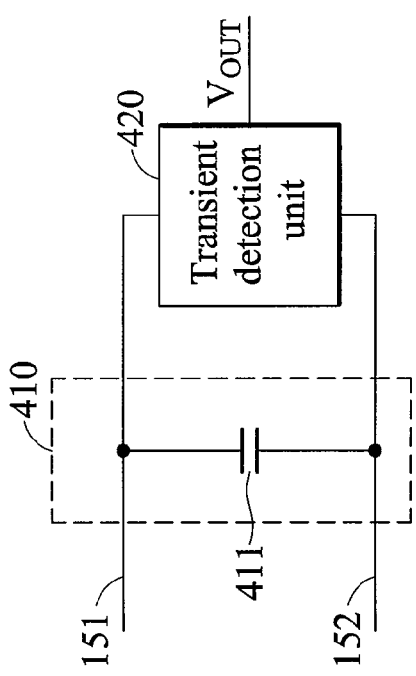
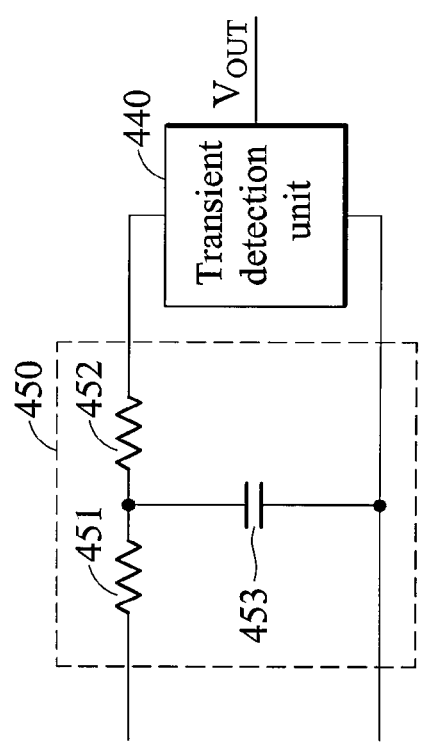
FIG. 4a
FIG. 4b
FIG. 4c
FIG. 4d

TRANSIENT TO DIGITAL CONVERTERS

BACKGROUND OF THE INVENTION

1. Field of the Invention

The invention relates to a digital converter, and more particularly to a digital converter generating a digital code according to an electrostatic discharge (ESD) pulse.

2. Description of the Related Art

With the advancement of semiconductor manufacturing, protection against electrostatic discharge (ESD) has become one of the most critical reliability issues for integrated circuits (IC). Several ESD test modes, such as machine mode (MM) or human body mode (HBM), have been proposed to imitate the circumstances under which ESD occurs. The ability to withstand certain levels of ESD is essential for successful commercialization of an IC.

ESD protection is also a critical reliability issues for integrated circuits (IC). As semiconductor processes advance toward deep sub-micron manufacturing, scaled-down devices and thinner gate oxides are more vulnerable to ESD stress. Generally, the input/output pads on IC chips must sustain at least 2 kVolt ESD of high stress in HBM or 200V in MM.

BRIEF SUMMARY OF THE INVENTION

Digital converters are provided. An exemplary embodiment of a digital converter comprises a first adjustment unit and a first transient detection unit. The first adjustment unit adjusts amplitude of an electrostatic discharge (ESD) pulse to generate a first adjustment signal when an ESD event occurs in a first power line and a second power line is at a complementary level. The first transient detection unit generates a first digital code according to the first adjustment signal.

Electronic products are also provided. An exemplary embodiment of an electronic product comprises a digital converter and a processing device. The digital converter comprises a first adjustment unit and a first transient detection unit. The first adjustment unit adjusts amplitude of an electrostatic discharge (ESD) pulse to generate a first adjustment signal when an ESD event occurs in a first power line and a second power line is at a complementary level. The first transient detection unit generates a first digital code according to the first adjustment signal. The processing device executes a specific action according to the first digital code.

A detailed description is given in the following embodiments with reference to the accompanying drawings.

BRIEF DESCRIPTION OF THE DRAWINGS

The invention can be more fully understood by referring to the following detailed description and examples with references made to the accompanying drawings, wherein:

FIG. 3 is a relationship diagram of the digital codes and the ESD pulse;

FIG. 4a is a schematic diagram of an exemplary embodiment of the adjustment unit;

FIGS. 4b~4d are schematic diagrams of other exemplary embodiments of the adjustment unit.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
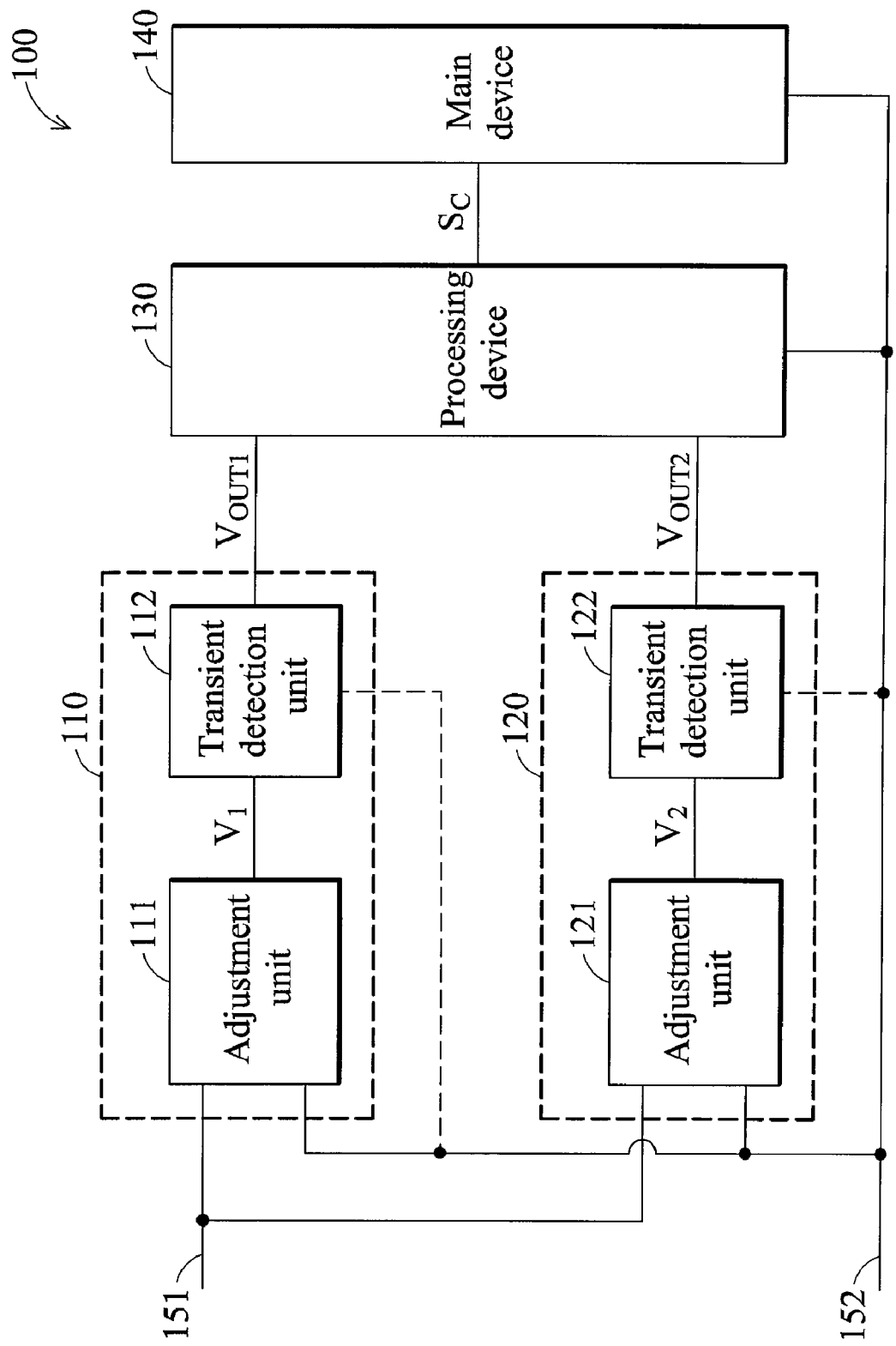
FIG. 1 is a schematic diagram of an exemplary embodiment of an electronic product.

FIG. 1 is a schematic diagram of an exemplary embodiment of an electronic product. The electronic product 100 comprises digital converters 110, 120, a processing device 130, and a main device 140. When an ESD event occurs in a power line 151 and a power line 152 is at a complementary level, the digital converter 110 generates digital code $V_{OUT1}$ according to amplitude of an ESD pulse generated by the ESD event. Similarly, the digital converter 120 generates digital code $V_{OUT2}$ according to the amplitude of an ESD pulse generated by the ESD event. In this embodiment, the level of converting of the digital converter 110 is different from the level of converting of the digital converter 120.

The processing device 130 executes a specific action according to the digital codes $V_{OUT1}$ and $V_{OUT2}$. In this embodiment, the specific action is generating a control signal $S_C$ to the main device 140. The main device 140 executes a related function according to the control signal $S_C$.

For example, the control signal $S_C$ is utilized to activate the main device 140 such that the main device 140 executes the related function according to the type of the electronic product 100. If the electronic product 100 is a mobile phone, the main device 140 executes communication functions. The control signal $S_C$ is also utilized to de-activate all the elements of the main device 140 or de-activate a portion of the elements of the main device 140.

The processing device 130 generates the control signal $S_C$ according to the digital codes $V_{OUT1}$ and $V_{OUT2}$. The digital codes $V_{OUT1}$ and $V_{OUT2}$ are generated according to the different ESD events. Thus, all the elements of the main device 140 are de-activated or a portion of the elements of the main device 140 are de-activated according to the different ESD events. For example, when the ESD pulse generated by the ESD event exceeds a preset value, all elements of the main device 140 are de-activated. When the ESD pulse generated by the ESD event is less than the preset value, a portion (50% or 30%) of the elements of the main device 140 are de-activated.

The number of the digital converters is not limited. In this embodiment, the electronic product 100 comprises two digital converters. In other embodiments, the electronic product 100 comprises at least one digital converter. The operating configurations of the digital converters 110 and 120 are described in greater detail with reference to FIG. 1.

The digital converter 110 comprises an adjustment unit 111 and a transient detection unit 112. The adjustment unit 111 adjusts the amplitude of an ESD pulse to generate an adjustment signal $V_1$ when the ESD event occurs in the power line 151 and the power line 152 is at a complementary level. The transient detection unit 112 generates the digital code $V_{OUT1}$ according to the adjustment signal $V_1$. Similarly, the digital converter 120 comprises an adjustment unit 121 and a transient detection unit 122. The adjustment unit 121 adjusts the amplitude of the ESD pulse to generate an adjustment signal $V_2$ when the ESD event occurs in the power line 151 and the power line 152 is at the complementary level. The transient detection unit 122 generates the digital code $V_{OUT2}$ according to the adjustment signal $V_2$. The level of adjustment of the adjustment unit 111 is different from the level of adjustment of the adjustment unit 121. Thus, the adjustment signal $V_1$ is different from the adjustment signal $V_2$. In this embodiment, the configuration of the digital converters 110 and 120 are the same. In other embodiment, the configuration of the digital converter 110 is different from the configuration of the digital converter 120.

In one embodiment, the adjustment units 111 and 121 reduce the amplitude of the ESD pulse. The level of reduction of the adjustment unit 111 is different from the level of reduction of the adjustment unit 121. For example, if the level of reduction of the adjustment unit 121 exceeds the level of reduction of the adjustment unit 111, the adjustment signal $V_2$ is less than the adjustment signal $V_1$. If the amplitude of the ESD pulse is less than a preset value, the adjustment unit 111 can detect the adjustment signal $V_1$ and the adjustment unit 121 cannot detect the adjustment signal $V_2$ because the adjustment signal $V_2$ is too small. Thus, the digital code $V_{OUT1}$ may be "1" and the digital code $V_{OUT1}$ may be "0". If the amplitude of the ESD pulse exceeds the preset value, the adjustment units 111 and 112 respectively detect the adjustment signals $V_1$ and $V_2$. Thus, the digital code $V_{OUT1}$ may be "1" and the digital code $V_{OUT1}$ may be "1". The level of the ESD pulse can be obtained according to the digital codes $V_{OUT1}$ and $V_{OUT2}$.

FIGS. 2a~2d are schematic diagrams of digital codes. Assuming an electronic product comprises four digital converters such that four digital codes $V_{OUT1}$~$V_{OUT4}$ can be obtained. Additionally, when the level of one digital code is 3.3V, the digital code can be referred to as "1". When the level of one digital code is 0V, the digital code can be referred to as "0".

Figure 2A:
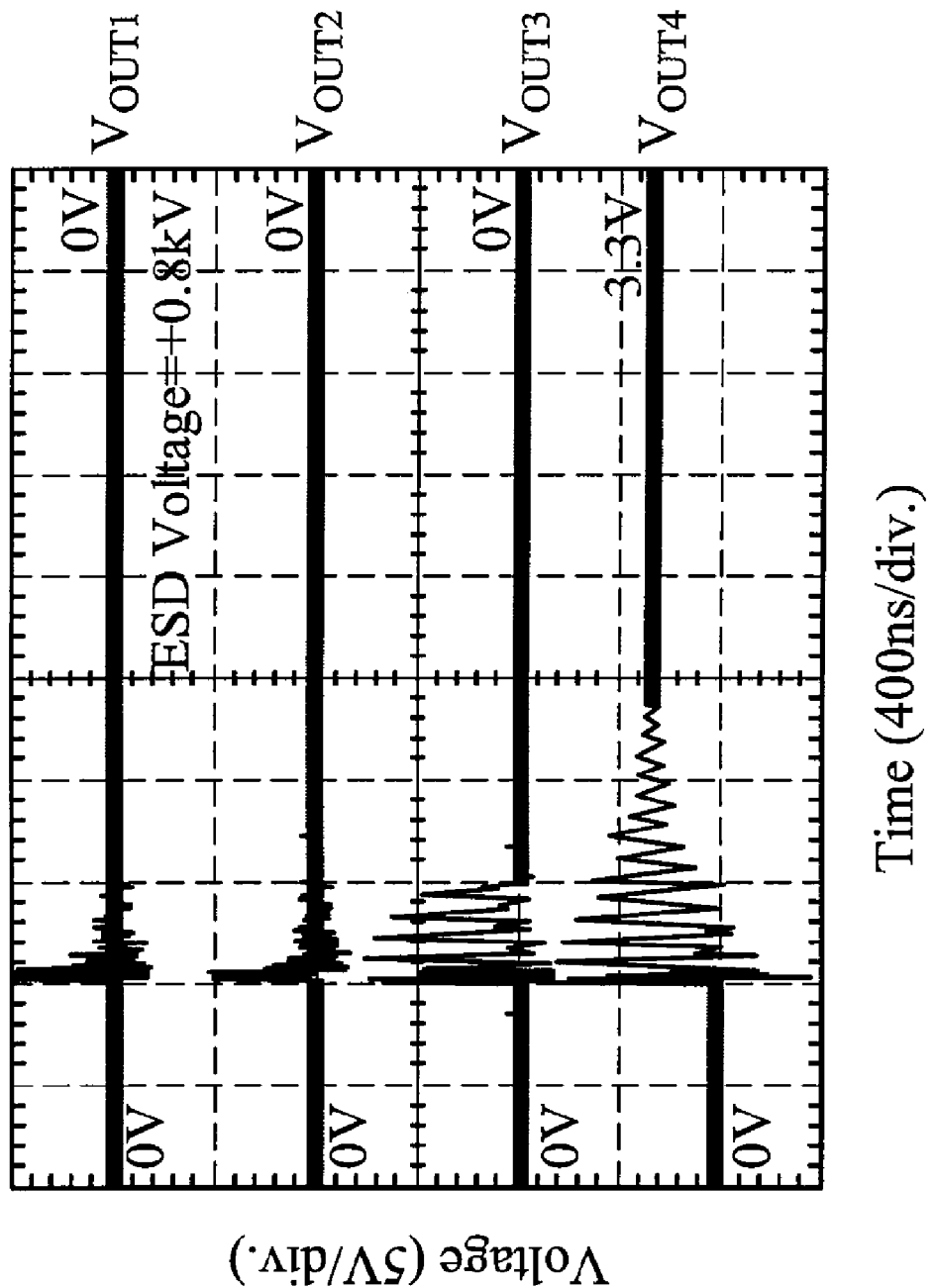
FIGS. 2a~2d are schematic diagrams of digital codes.
Figure 2B:
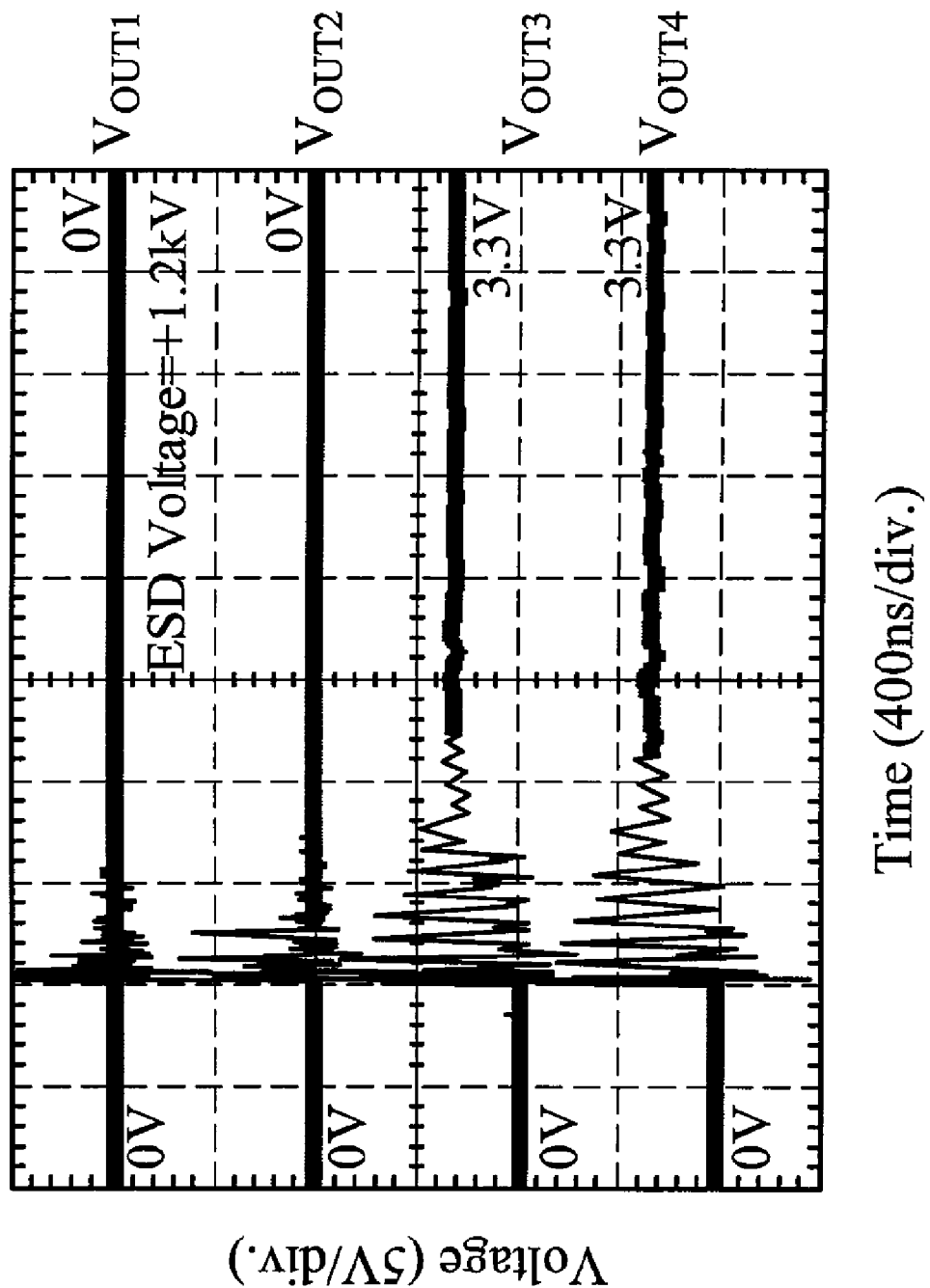

Referring to FIG. 2a, when the amplitude of the ESD pulse is 0.8 kV, the level of the digital codes $V_{OUT1}$~$V_{OUT3}$ are 0V and the level of the digital code $V_{OUT4}$ is 3.3V. Thus, digital codes $V_{OUT1}$~$V_{OUT4}$ can be referred to as "0001". Referring to FIG. 2b, when the amplitude of the ESD pulse is 1.2 kV, the level of the digital codes $V_{OUT1}$ and $V_{OUT2}$ are 0V and the level of the digital codes $V_{OUT3}$ and $V_{OUT4}$ are 3.3V. Thus, digital codes $V_{OUT1}$~$V_{OUT4}$ can be referred to as "0011".

Figure 2C:
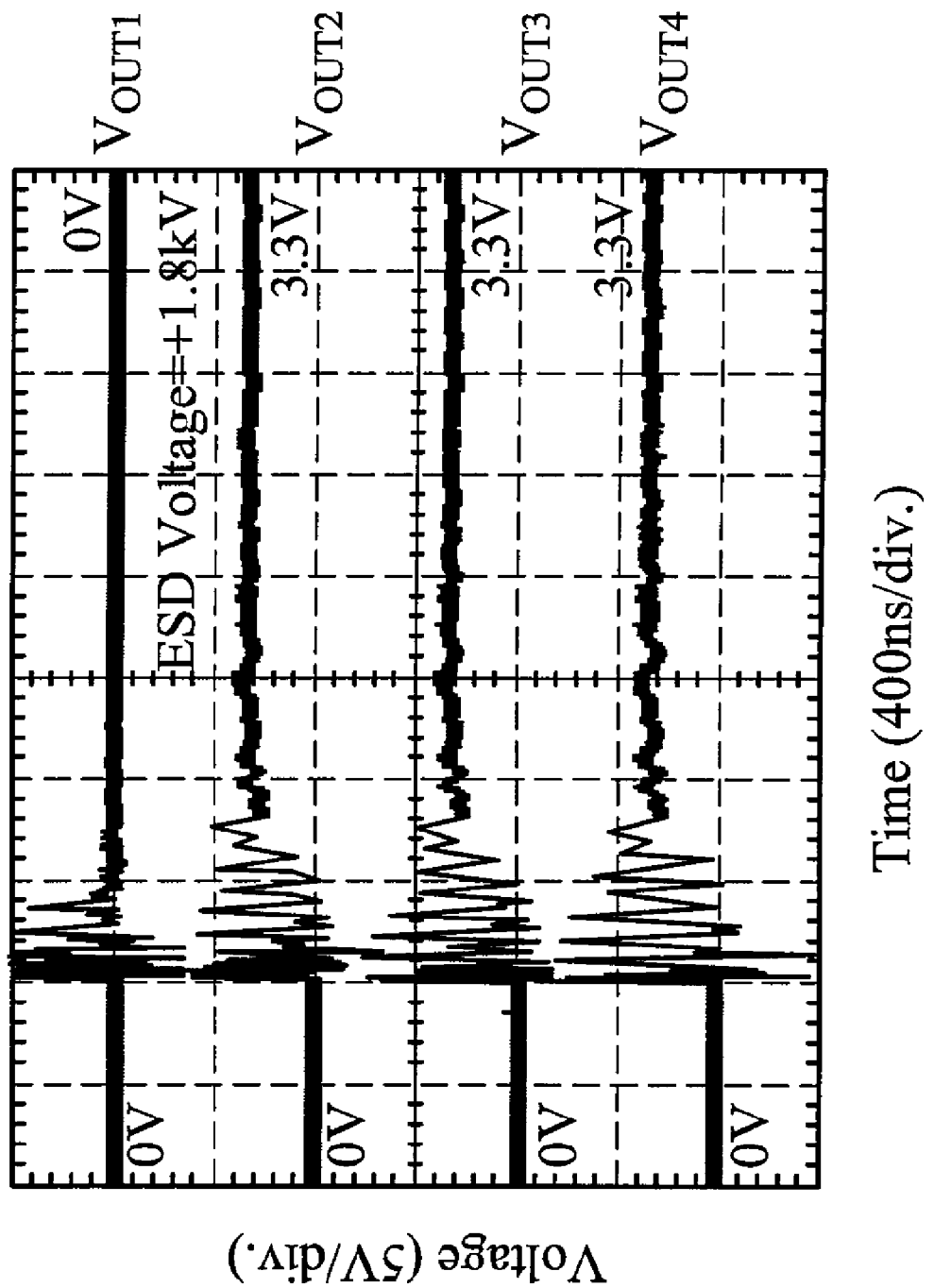
Figure 2D:
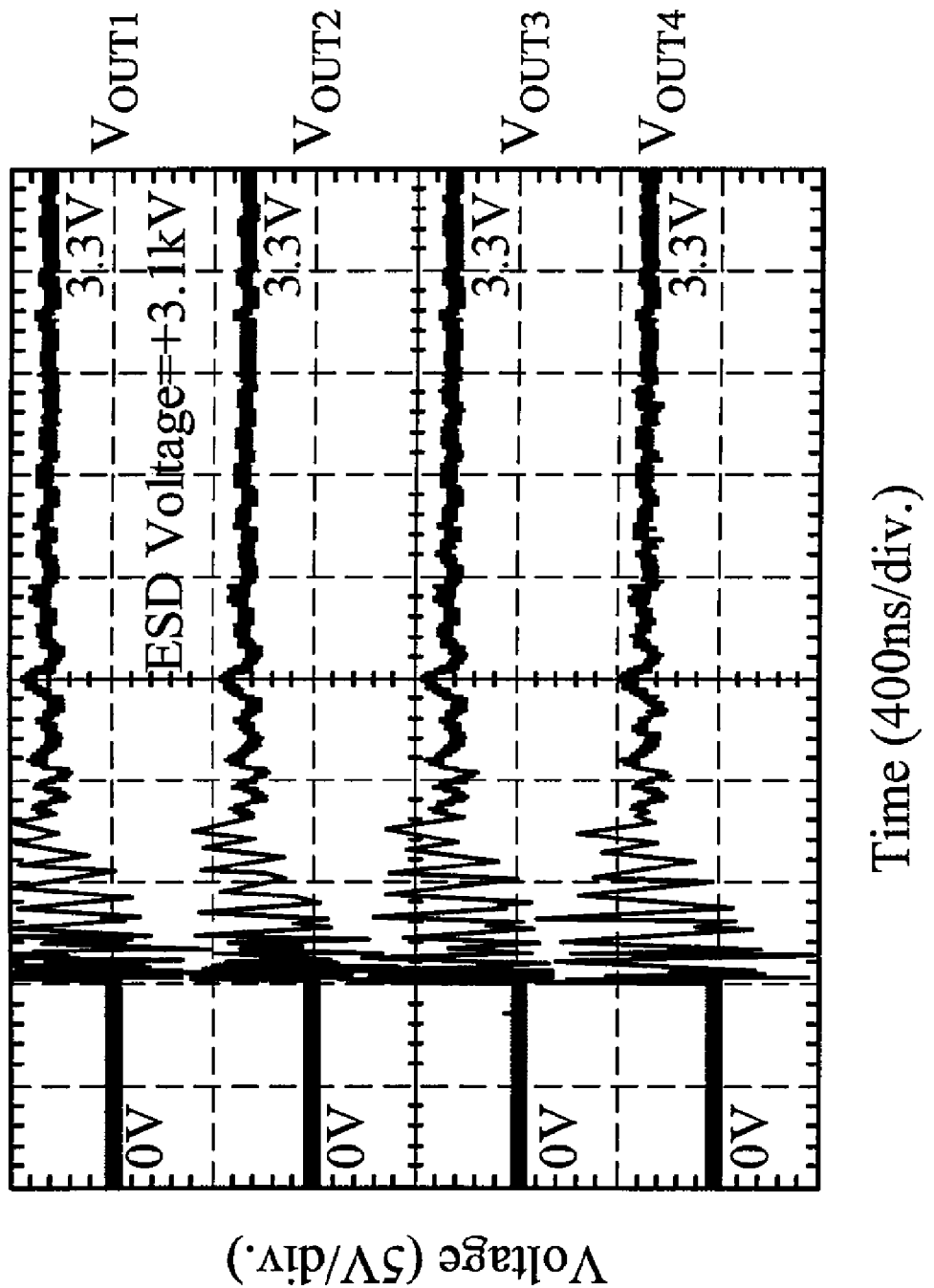

Referring to FIG. 2c, when the amplitude of the ESD pulse is 1.8 kV, the level of the digital code $V_{OUT1}$ is 0V and the level of the digital codes $V_{OUT2}$~$V_{OUT4}$ are 3.3V. Thus, digital codes $V_{OUT1}$~$V_{OUT4}$ can be referred to as "0111". Referring to FIG. 2d, when the amplitude of the ESD pulse is 3.41 kV, the level of the digital codes $V_{OUT1}$~$V_{OUT4}$ are 3.3V. Thus, digital codes $V_{OUT1}$~$V_{OUT4}$ can be referred to as "1111".

FIG. 3 is a relationship diagram of the digital codes and the ESD pulse. When the digital codes $V_{OUT1}$~$V_{OUT4}$ are referred to as "0000", the ESD pulse is less than 0.8 kV. When the digital codes $V_{OUT1}$~$V_{OUT4}$ are referred to as "0001", the ESD pulse is 0.8 Kv~1.2 kV. When the digital codes $V_{OUT1}$~$V_{OUT4}$ are referred to as "0011", the ESD pulse is 1.2 Kv~1.8 kV. When the digital codes $V_{OUT1}$~$V_{OUT4}$ are referred to as "0111", the ESD pulse is 1.8 Kv~3.1 kV. When the digital codes $V_{OUT1}$~$V_{OUT4}$ are referred to as "1111", the ESD pulse exceeds 3.1 kV.

FIG. 4a is a schematic diagram of an exemplary embodiment of the adjustment unit. The configuration of the digital converter 110 is different from or is the same as the configuration of the digital converter 120. The configuration of the adjustment unit is not to be limited. Any circuit configuration adjusting the ESD pulse can serve as the adjustment unit.

Referring to FIG. 4, the adjustment unit 410 is a capacitor 411. The amount of the ESD current, which passes through the transient detection unit 420, can be controlled according to the capacitance of the capacitor 411. For example, assuming an ESD event occurs in the power line 151 and the power line 152 is at a complementary level (such as a ground level). One half of the ESD current generated by the ESD event passes through the capacitor 411 and the other half passes through the transient detection unit 420. Thus, the transient detection unit 420 generates the corresponding digital code.

FIG. 4b is a schematic diagram of another exemplary embodiment of the adjustment unit. The adjustment unit 430 comprises a resistor 431 and a capacitor 432. In this embodiment, the resistor 431 and the capacitor 432 constitute an L-type RC filter. The voltage of the node 433 can be controlled according to the impedance value of the resistor 431 and the capacitance value of the capacitor 432. The transient detection unit 420 generates the corresponding digital code according to the voltage of the node 433.

FIG. 4c is a schematic diagram of another exemplary embodiment of the adjustment unit. The adjustment unit 450 comprises resistors 451, 452, and a capacitor 453. In this embodiment, the resistors 451, 452, and the capacitor 453 constitute a T-type RC filter. FIG. 4d is a schematic diagram of another exemplary embodiment of the adjustment unit. The adjustment unit 450 comprises a resistor 461 and capacitors 462 and 463. In this embodiment, the resistor 461 and the capacitors 462 and 463 constitute a π-section RC filter. In other embodiment, a plurality of π-section RC filter are connected in serial.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A digital converter, comprising:
   a first adjustment unit adjusting amplitude of an electrostatic discharge (ESD) pulse to generate a first adjustment signal when an ESD event occurs in a first power line and a second power line is at a complementary level; and
   a first transient detection unit generating a first digital code according to the first adjustment signal.

2. The digital converter as claimed in claim 1, wherein the first adjustment unit is a capacitor.

3. The digital converter as claimed in claim 2, wherein the first transient detection unit is connected to the capacitor in parallel.

4. The digital converter as claimed in claim 1, wherein the first adjustment unit comprises:
   a resistor coupled between the first power line and a node; and
   a capacitor coupled between the node and the second power line.

5. The digital converter as claimed in claim 4, wherein the first transient detection unit is connected to the capacitor in parallel.

6. The digital converter as claimed in claim 1, wherein the first adjustment unit comprises:
   a first resistor coupled between the first power line and a first node;
   a capacitor coupled between the first node and the second power line; and
   a second resistor coupled between the first node and a second node.

7. The digital converter as claimed in claim 6, wherein the first transient detection unit is coupled between the second node and the second power line.

8. The digital converter as claimed in claim 1, wherein the first adjustment unit comprises:

a first capacitor coupled between the first and the second power lines;

a resistor coupled between he first power line and a first node; and a second capacitor coupled between the first node and the second power line.

9. The digital converter as claimed in claim 8, wherein the first transient detection unit is connected to the second capacitor in parallel.

10. The digital converter as claimed in claim 1, further comprising:

a second adjustment unit adjusting the amplitude of the ESD pulse to generate a second adjustment signal; and a second transient detection unit generating a second digital code according to the second adjustment signal.

11. An electronic product, comprising:

a digital converter comprising:

a first adjustment unit adjusting amplitude of an electrostatic discharge (ESD) pulse to generate a first adjustment signal when an ESD event occurs in a first power line and a second power line is at a complementary level; and a first transient detection unit generating a first digital code according to the first adjustment signal; and a processing device executing a specific action according to the first digital code.

12. The electronic product as claimed in claim 11, further comprising a main device executing a related function according to the type of the electronic product.

13. The electronic product as claimed in claim 11, wherein the specific action is de-activating the main device.

14. The electronic product as claimed in claim 11, wherein the processing unit de-activates the main device when the ESD event occurs in the first power line, and the processing unit activates the main device when the ESD event does not occur in the first power line.

15. The electronic product as claimed in claim 11, wherein the first adjustment unit is a capacitor.

16. The electronic product as claimed in claim 15, wherein the first transient detection unit is connected to the capacitor in parallel.

17. The electronic product as claimed in claim 11, wherein the first adjustment unit comprises:

a resistor coupled between the first power line and a node; and a capacitor coupled between the node and the second power line.

18. The electronic product as claimed in claim 17, wherein the first transient detection unit is connected to the capacitor in parallel.

19. The electronic product as claimed in claim 11, wherein the first adjustment unit comprises:

a first resistor coupled between the first power line and a first node;

a capacitor coupled between the first node and the second power line; and a second resistor coupled between the first node and a second node.

20. The electronic product as claimed in claim 19, wherein the first transient detection unit is coupled between the second node and the second power line.

21. The electronic product as claimed in claim 11, wherein the first adjustment unit comprises:

a first capacitor coupled between the first and the second power lines;

a resistor coupled between he first power line and a first node; and a second capacitor coupled between the first node and the second power line.

22. The electronic product as claimed in claim 21, wherein the first transient detection unit is connected to the second capacitor in parallel.

23. The electronic product as claimed in claim 11, further comprising:

a second adjustment unit adjusting the amplitude of the ESD pulse to generate a second adjustment signal; and a second transient detection unit generating a second digital code according to the second adjustment signal.

24. The electronic product as claimed in claim 23, wherein the processing device executes the specific action according to the second digital code.

* * * * *